United States Patent [19]
Chen et al.

[11] Patent Number: 5,904,570
[45] Date of Patent: *May 18, 1999

[54] METHOD FOR POLYMER REMOVAL AFTER ETCHING

[75] Inventors: Sen-Fu Chen, Taipei; Bao-Ru Yang, I-Lan; Wen-Cheng Chang, Tao-Yuan; Heng-Hsin Liu, Hsin-Chu, all of Taiwan

[73] Assignee: Taiwan Semiconductor Manufacturing Company, Ltd., Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/650,357

[22] Filed: May 20, 1996

[51] Int. Cl.⁶ ................................................. H01L 21/306
[52] U.S. Cl. .............................. 438/725; 216/41; 216/67; 134/1.2; 438/735
[58] Field of Search .................................... 438/725, 735; 216/41, 67; 134/1.2

[56] References Cited

U.S. PATENT DOCUMENTS 5,296,093  3/1994  Szwejkowski .
5,399,464  3/1995  Lee .

OTHER PUBLICATIONS

CA:115:218649, Chem Abstract of "Effect of different surfaces on plasma stripping of photoresist", Chanana, Microelectron. J., 1991.

CA:124:18437, abs of SU1653442 (also attached a WPIDS derwent abs of the SU patent), Apr.1995.

"A Proven Sub–micron Photoresist Stripper Solution for Post Metal and Via Hole Processes" by Wai Mun Lee, EKC Technology, Inc. 2520, Barrington, Ct. Hayward CA pp.1–6.

Primary Examiner—Gary Geist
Assistant Examiner—Jean F. Vollano
Attorney, Agent, or Firm—George O. Saile; Stephen B. Ackerman

[57] ABSTRACT

The polymeric residues which remain after the plasma-enhanced subtractive etching of polycrystalline layers in reactive halogen-containing gases are removed by a combination ashing in oxygen gas and subsequent removal with an organic solvent.

7 Claims, 1 Drawing Sheet

METHOD FOR POLYMER REMOVAL AFTER ETCHING

BACKGROUND OF THE INVENTION

(1) Field of the Invention

The invention relates to a method for removal of residues after pattern etching in the fabrication of integrated circuits which employs an organic solvent which is more effective in the removal of the polymerized residue left after plasma-enhanced etching of polycrystalline silicon layers, or polysilicon, and is not potentially deleterious to the rest of the integrated circuit.

(2) Description of the Prior Art

The etching of layers of polysilicon into patterns useful in the manufacture of semiconductor integrated circuits is done by plasma-enhanced reactive gases such as chlorine, hydrogen bromide, and sulfur hexafluoride. Such subtractive etching reactions leave behind a residue after etching is complete and the photoresist etching mask is removed by ashing in oxygen plasma. This residue is found on the sidewall of the trench etched in the polysilicon and must be removed. The residue consists of a complex polymer formed from photoresist, the reactive gases, and their reaction products. It is commonly removed by using ammonia and hydrofluoric acid solutions, but this process must be carefully controlled to prevent these reagents from attacking portions of the integrated circuit such as the gate oxide insulation and tungsten metallization, for example. U.S. Pat. No. 5,296,093 to Szwejkowski shows the conventional use of ammonia and hydrofluoric acid solutions for residue removal after etching. Organic solvents have not been considered for this purpose due to concern over the introduction of contaminants. The use of organic solvents for stripping photoresist has been discussed in "A Proven Submicron Photoresist Stripper Solution for Post Metal and Via Hole Processes" by Wai Mun Lee, EKC Technology, Inc. 2520. Barrington Ct. Hayward, Calif. pp. 1–6, but not in combination with ashing removal of photoresist or the presence of polymeric residues or their removal.

SUMMARY OF THE INVENTION

It is a principal object of the present invention is to provide an effective method for the removal of the polymerized residue remaining after the plasma-enhanced subtractive etching of polysilicon layers into the desired pattern. It is another object of the invention to relate a method for polysilicon pattern formation residues removal after subtractive etching which is not potentially deleterious to other components of the integrated circuit. In accordance with the objectives of the invention, the polymeric residues which remain after the plasma-enhanced subtractive etching of poly-silicon layers in reactive halogen-containing gases are removed by a combination of ashing in oxygen gas and removal with an organic solvent.

BRIEF DESCRIPTION OF THE DRAWING

In the accompanying drawings forming a material part of this description, there is shown.

DESCRIPTION OF THE PREFERRED EMBODIMENT

Figure 1:
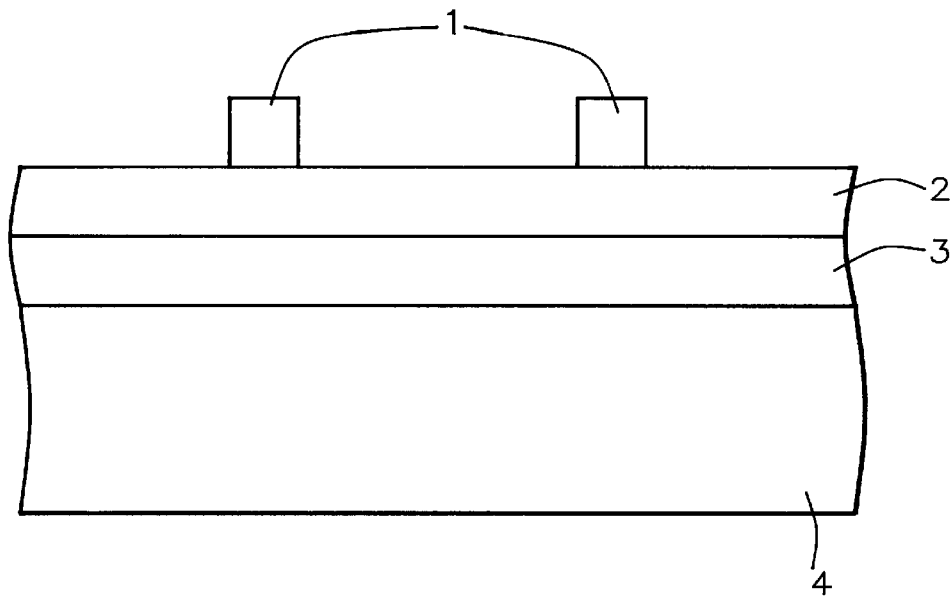
FIG. 1 is a schematic cross-sectional diagram of a portion of an integrated circuit under fabrication.
Figure 2:
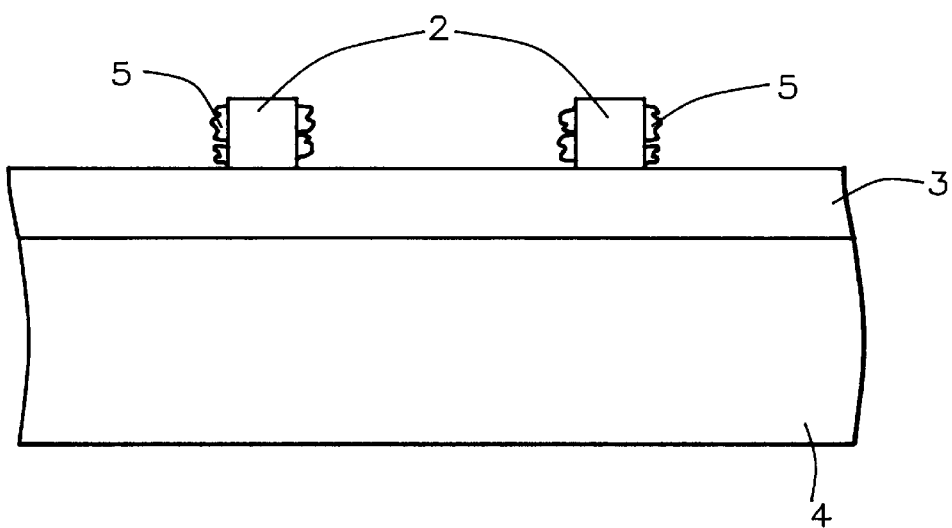
FIG. 2 is a schematic cross-sectional diagram of a portion of an integrated circuit showing residue formation after anisotropic etching of polysilicon.

Referring now more particularly to FIG. 1, there is shown a portion of an integrated circuit under fabrication. A photoresist pattern 1 has been formed to act as an etching mask during the anisotropic subtractive etching of the underlying polysilicon layer 2, which in turn rests on an underlying oxide layer 3 and the rest of the integrated circuit substrate. Upon subtractive etching of the polysilicon in halogen-containing gases activated by an electrical plasma, a vertical sidewall pattern of polysilicon is formed. Referring now more particularly to FIG. 2, the etched pattern of polysilicon 5 is shown after stripping of the photoresist mask 1 in an oxygen plasma. A residue 6 remains on the polysilicon pattern, consisting of a complex polymer formed from the process residues. This residue must be essentially removed before further processing, or else it is converted to deleterious substances which cannot be removed and will interfere with subsequent manufacturing processes and ultimate circuit functionality and reliability.

In the prior art, removal of the residues described has been accomplished by inorganic chemical substances such as aqueous solutions of alkaline, ammoniacal, or fluoride species. With reference to FIGS. 1 and 2, it can be seen that the potential for unwanted chemical attack by such residue-removing substances on the rest of the integrated circuit exists. In particular, oxide layers are subject to such unwanted deleterious exposure. Accordingly, it has been found that mixtures of certain organic substances efficiently remove the unwanted residues without risking such adverse side effects. Among the most efficaceous mixtures are those of solvents which do not contain protons, and organic amines. Solvents which do not contain available protons, or hydrogen ions, are referred to as aprotic solvents. A typical example is 2-methyl pyrrolidone, also known as N-methyl pyrrolidone (NMP). When mixed in the appropriate proportions with an organic amine such as piperidine, for example, this combination readily removes photoresist and etching residues. Many other combinations exist which are well-suited to this purpose. Among the aprotic solvents which are useful for this purpose are dimethyl formamide, dimethylacetamide, dimethylsulfoxide, and sulfolane, among others. The organic amines may be selected from the class whose general structural chemical formula is given by R—NH2, where R— is any general organic structural group.

The preferred process for residue removal after polysilicon subtractive etching employs dipping of the integrated circuit wafers under fabrication in small groups or lots at one time into the solvent mixture until the residue is removed. This is carried out after the photoresist mask defining the polysilicon pattern is removed or stripped by an oxygen plasma.

While the invention has been particularly shown and described with reference to the preferred embodiments thereof, it will be understood by those skilled in the art that various changes in form and details may be made without departing from the spirit and scope of the invention.

What is claimed is:

1. A method for removal of residues formed during the plasma-enhanced subtractive etching of polysilicon layers in integrated circuit fabrication, comprising the steps of:

etching the polysilicon layers in a reactive halogen-containing plasma, using a photoresist etch mask;

removing the photoresist etch mask using an oxygen plasma; and removing said residues using an organic solvent, wherein the organic solvent is a mixture consisting of at least one organic amine and at least one aprotic solvent, wherein the organic amine is selected from the group consisting of primary amines and piperidine.

2. The method of claim 1 in which the aprotic solvent is N-methylpyrrolidone and the amine is chosen from the class whose generic structural formula is R—NH2 where R— is any general organic structural group.

3. A method for removal of potentially deleterious residues of a complex polymer formed during anisotropic etching of polysilicon in a reactive halogen-containing plasma comprising the steps of:

etching said polysilicon using a mixture of chlorine (Cl2), hydrogen bromide (HBr) and sulfur hexafluoride (SF6);

removing a photoresist etch mask from said polysilicon layer using an oxygen plasma, after which polymer residue remains on said polysilicon; and removing said polymer residue using an organic solvent, wherein the organic solvent is a mixture consisting of at least one organic amine and at least one aprotic solvent, wherein the organic amine is selected from the group consisting of primary amines and piperidine.

4. The method of claim 2 where the organic amines are chosen from the class having the generic chemical structure given by R—NH2 where R— is any general organic structural group.

5. The method of claim 3 wherein the aprotic solvent is selected from among the group consisting of N-methyl pyrrolidone, dimethylformamide, dimethylacetamide, dimethyl sulfoxide, and sulfolane.

6. A method for removal of a polymerized residue remaining after plasma-enhanced subtractive etching of polysilicon layers during fabrication of integrated circuits, comprising the steps of:

using an oxygen plasma to strip a photoresist mask after said plasma-enhanced subtractive etching; and removal of the remaining residue by a mixture of organic solvents, wherein the organic solvent is a mixture consisting of at least one organic amine and at least one aprotic solvent, wherein the organic amine is selected from the group consisting of primary amines and piperidine, and wherein the aprotic solvent or solvents are selected from the group consisting of N-methyl pyrrolidone, dimethylformamide, dimethylacetamide, and sulfolane.

7. The method of claim 6 wherein the organic amine or amines are selected from the class having the generic structural formula R—NH2 where R— is any organic structural group.

* * * * *